United States Patent [19]

Wood et al.

[11] 4,346,124

[45] Aug. 24, 1982

[54] METHOD OF APPLYING AN ADHESIVE TO A CIRCUIT CHIP

[75] Inventors: Laurier A. Wood, Amherst; Donald N. Humphries, Bedford, both of N.H.

[73] Assignee: Laurier Associates, Inc., Hudson, N.H.

[21] Appl. No.: 259,854

[22] Filed: May 4, 1981

[51] Int. Cl.$^3$ ............................................. H01L 21/58
[52] U.S. Cl. ....................................... 427/82; 427/96; 427/207.1; 118/265
[58] Field of Search ............... 118/422, 264, 401, 265; 427/82, 96, 207.1, 208.6, 208.4; 29/832, 834, 740

[56] References Cited

U.S. PATENT DOCUMENTS 3,638,304 2/1972 Bleil .................................. 427/96 X
3,963,551 6/1976 Marlinski ....................... 118/401 X

OTHER PUBLICATIONS

Towers, T. D., *Hybrid Microcircuits,* Crane, Russak and Company, Inc., N.Y., 1977, pp. 20 to 23.

*Primary Examiner*—John D. Smith
*Assistant Examiner*—Bernard F. Plantz
*Attorney, Agent, or Firm*—Wolf, Greenfield & Sacks

[57] ABSTRACT

A method for applying an epoxy glue, solder paste or a similar material to the surface of a planar circuit chip, such as a silicon integrated circuit chip. Positioned just above the liquid epoxy in the bath is a fine mesh, stainless steel screen clamped at its periphery and having supported thereover a leveling paddle with a micrometer adjustment rotatable relative to the bath itself for smoothing the material over the screen surface. After this smoothing or leveling operation, the chip, usually held by a vacuum chuck, is pressed against the screen into the epoxy with the screen functioning as a resilient means enabling the chip to be withdrawn therefrom with uniform deposition of material applied to the undersurface thereof. The apparatus may also have a spongy material such as polyurethane or a sponge neoprene rubber under the screen to enhance chip removal.

2 Claims, 5 Drawing Figures

U.S. Patent  Aug. 24, 1982  4,346,124
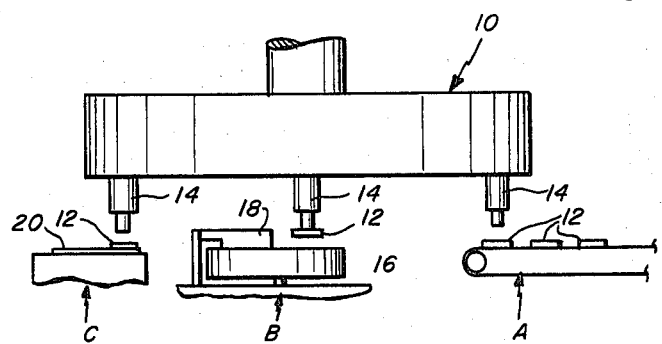
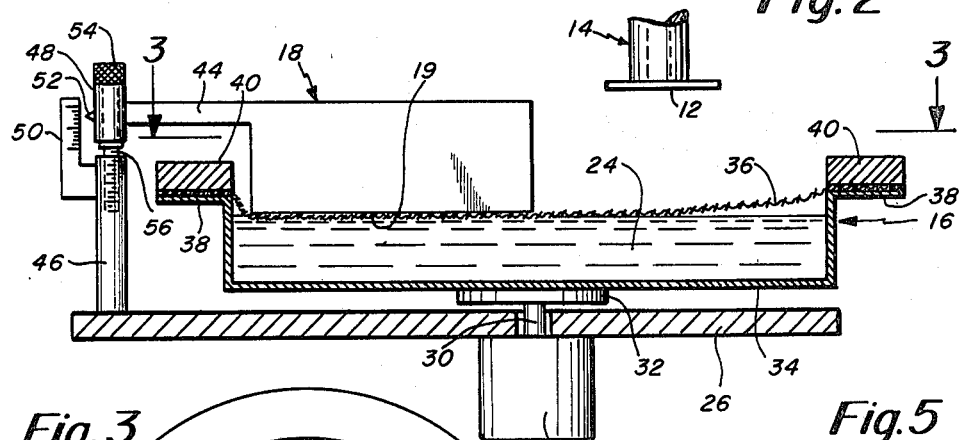
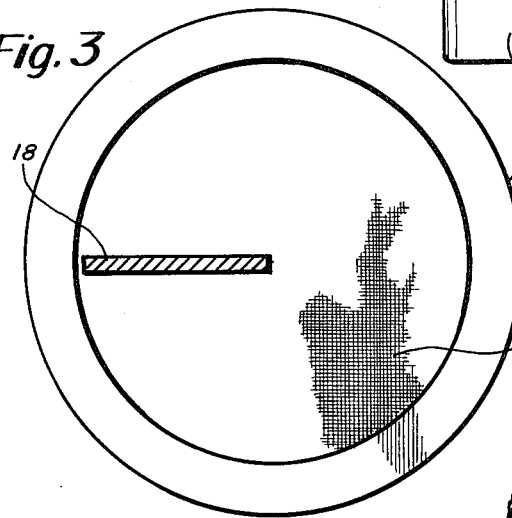
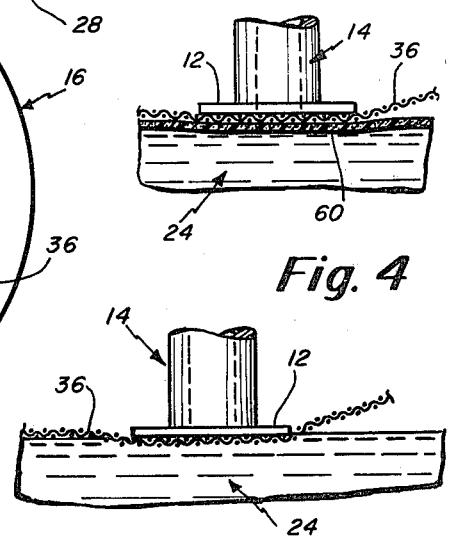

METHOD OF APPLYING AN ADHESIVE TO A CIRCUIT CHIP

BACKGROUND OF THE INVENTION

The present invention relates in general to a chip coater and pertains, more particularly, to an improved method for applying a bonding material such as an epoxy glue to the surface of a circuit chip; the method forming one of a number of different steps used in securing circuit chips to a substrate such as a printed circuit or ceramic board.

In the fabrication of hybrid circuits, the steps that are followed generally include the steps of picking up a chip at one location, bringing the circuit chip to another location where it is subjected to a coating, and thereafter, moving the chip to a third location where the chip is properly aligned and oriented with a substrate upon which it is being secured by means of the material, such as epoxy. The movement between these different stations where the method is performed usually occurs by use of a rotating or traversing mechanism having the vacuum chuck for picking up the circuit chip. A problem has been encountered, however, when the circuit chip is lowered into the material so that the undersurface of the chip may be coated with a bonding film. The problem is that many times the surface tension between the circuit chip and the material, such as an epoxy bath, is sufficient to disengage the circuit chip from the vacuum chuck. This is most troublesome in that it interrupts the normal sequence of steps and also requires that the equipment be set up again for operation.

Accordingly, an object of the present invention is to provide an improved method for applying a uniform adhesive film to a circuit chip without the usual attendant problem of disengaging the chip from the vacuum chuck. The uniformity of the epoxy is improved with the adhesive passing through a screen directly onto the chip.

SUMMARY OF THE INVENTION

To accomplish the foregoing and other objects of this invention, there is provided an improved method for applying an adhesive film to a circuit chip or the like. Three steps that are employed in fabricating an integrated circuit include a mechanism having three stations including a first station where the chip is selected, usually by a vacuum chuck, a second station where the circuit chip is subjected to coating, and a third station at which is located a substrate to which the circuit chip is applied in the proper orientation relative to the substrate. The mechanism that moves the circuit chip between these different stations may be of conventional design and may be of a rotary or traversing type. In order to prevent the circuit chip from being dislodged from the vacuum chuck, in accordance with the present invention, there is provided an improved epoxy bath apparatus which comprises a bath tray that has a fine mesh, stainless steel screen clamped at the periphery of the bath tray. The bath tray is adapted for rotation by a rotational drive mechanism disposed therebelow, and the material tray is preferably rotated through a random angle, such as a full 360 degree angle for each circuit chip that is presented to the bath. A leveling paddle is vertically disposed over the tray and screen and is adapted to be maintained in a fixed, non-rotational position, but is finely adjustable in a vertical direction to adjust the tension imposed on the mesh screen by the bottom edge of the leveling paddle. The leveling paddle extends at one end close to the periphery of the tray and at the other end, to about the midpoint of the tray. The vacuum chuck with the chip held thereby, is adapted for entering the tray on the opposite side of the bath tray from the leveling paddle, so as not to interfere with the leveling paddle. However, prior to entry of the vacuum chuck, the bath tray is rotated with the leveling paddle causing a leveling or smoothing of the material. The leveling paddle actually dips the screen into the material as the tray is rotated so that the entire screen (fine wires comprising the screen) picks up a quantity of the adhesive material. As soon as the smoothing operation has occurred, then the vacuum chuck with the circuit chip held therein progresses toward the material container with the circuit chip being moved against the resilient screen with the liquid adhesive from the screen then being transferred to the circuit chip. The adhesive under the screen is strained uniformly through the screen and deposited uniformly onto the chip. As the vacuum chuck is withdrawn, the screen provides some resiliency to assist in moving the chip away from the bath without any disengagement of the circuit chip from its vacuum chuck. In order to enhance the removal of the chip from the screen it is preferred to provide a piece of spongy material which is disposed between the screen and the support cup or tray for the liquid adhesive. This sponge functions as a storage pad for the liquid adhesive as well as a spring in that it is compressed during the transfer and pushes the chip out of the material via the screen.

In accordance with the method of this invention, the circuit chip is brought to the station, the adhesive tray is rotated preferably through some angle, such as 360 degree rotation or less, the circuit chip is then moved against the fine screen mesh where the material costs the lower surface of the chip and then the chip is withdrawn from the path for movement to the following station with the chip being provided with a uniform layer of the material such as an epoxy adhesive glue. The leveling paddle not only causes a sweeping and smoothing action across the screen, but also tends to bias the screen so that it functions quite resiliently against the circuit chip.

BRIEF DESCRIPTION OF THE FIGURES

Numerous other objects, features and advantages of the invention should now become apparent upon a reading of the following detailed description taken in conjunction with the accompanying drawings, in which:

FIG. 1 schematically illustrates the general apparatus employed in fabricating integrated circuits but employing the improved adhesive bath of this invention;

FIG. 2 is cross-sectional view taken through the bath apparatus showing the details thereof.

FIG. 3 is a top view as taken along line 3—3 of FIG. 2 and partially taken through the leveling paddle;

FIG. 4 is a fragmentary view of a portion of the mesh screen showing the action as the vacuum chuck presses the circuit chip against the screen; and FIG. 5 is a second fragmentary view of a portion of the mesh screen showing the further use of a sponge disposed under the screen.

DETAILED DESCRIPTION

FIG. 1 schematically shows the mechanism 10 that may be employed in carrying circuit chips, such as the chip 12 from station to station. In the actual embodiment of FIG. 1, there are a number of vacuum chucks 14 that may be operated in sequence for carrying the circuit chip from one station to the other. These stations include station A where a plurality of these chips 12 are arranged to be picked up by the vacuum chuck. The station B shown in FIG. 1 is the epoxy bath station and in accordance with the present invention, this includes,, inter alia, a bath tray 16 and a leveling paddle 18. These components along with the other components comprising the bath apparatus are shown in more detail in FIGS. 2-4. Finally, station C is shown in FIG. 1. This station has the substrate 20 positioned thereat. The vacuum chuck 14 carries the circuit chip 12 after having been subjected to the bath, to station C where the circuit chip is properly oriented on the substrate 20. FIG. 1 shows the circuit chip 12 already positioned by the vacuum chuck. The vacuum chuck, of course, traverses in a vertical direction to pick up the chip, subject the chip to the bath, and to also secure the chip to the substrate and withdraw the vacuum chuck therefrom.

FIG. 2 is a cross-sectional view taken through the bath tray 16 showing the liquid glue 24 disposed therein. The bath tray 16 is supported over a table 26 in a manner so that it can be rotated by means of the drive motor 28. The drive motor 28 has an output shaft 30 coupled to a securing plate 32 which is, in turn, fixed to the bottom 34 of the bath tray 16. The motor 28 is preferably adapted to be controlled to rotate the bath tray 16 throug one full 360 degree rotation. The motor 28 is, of course, also secured to the table 26 to hold the bath tray at a set vertical position but free to be rotated by the motor 28.

A fine mesh, stainless steel screen 36 is secured to the periphery of the bath tray 16. In this regard, the bath tray 16 has a peripheral flange 38 which is used in combination with a clamp ring 40 to clamp the peripheral edge of the screen 36 in the bath tray. The screen 36 may be supported in a relatively taut position across the bath tray.

The leveling paddle 18 has a bottom edge 19 that engages the fine mesh screen. The leveling paddle 18 also has a support arm 44 for supporting the leveling paddle from a support member. The support member includes a lower post 46 supported from the table 26 and an upper stud 48 that has a threaded end engaged in a threaded hole in the lower post 46. The post 46 may also carry a scale 50 while the upper stud 48 carries a pointer 52 associated with the scale 50. A knurled knob 54 connects with the threaded end 56 while the upper stud 48 is adapted to receive the arm 44 of the leveling paddle. By rotating the knurled knob 54, the leveling paddle may be finely adjusted by a micrometer adjustment so that the leveling paddle can be adjusted in a vertical direction to change the pressure applied by the leveling paddle on the mesh screen. As the liquid in the bath tray 16 is used when they want to move the leveling paddle downwardly so that the mesh screen is urged into the epoxy bath, at leaset in the vicinity of the leveling paddle. In accordance with the operation of the bath, prior to the circuit chip being extended into the bath, the bath tray 16 is rotated relative to the stationary leveling paddle. The leveling paddle, thus, sweeps relative to the screen and as this sweeping action occurs, the screen is pressed into the epoxy with the epoxy being forced upwardly through and about the screen. As soon as this sweeping and smoothing action occurs, then the vacuum chuck 14 may move the circuit chip from a position, such as shown in FIG. 2, to the position of FIG. 4. It is noted in FIG. 2 that prior to introducing the circuit chip, the mesh screen therebelow may even be slightly above the liquid level, but in that area, the screen is retaining the epoxy previously applied to the screen by the paddle sweeping action.

FIG. 4 shows the vacuum chuck 14 carrying the circuit chip 12 downwardly to engage the fine mesh screen 36. This action preferably causes the screen to dip into the epoxy as shown in FIG. 4. The screen in a sense is biased by the action of the vacuum chuck so that when the vacuum chuck is withdrawn, the screen which is resilient tends to assist in the lifting action, thus, preventing the circuit chip 12 from disengaging by surface tension between the circuit chip and the bar. Moreover, the mesh screen tends to apply the material in a uniform grid manner to the undersurface of the circuit chip, thus, essentially interrupting the surface tension over the entire surface. This also tends to minimize surface tension between the circuit chip and epoxy bath. All in all, the use of the fine mesh screen permits the uniform application of the glue without the circuit chip disengaging from the vacuum chuck.

FIG. 5 shows an alternate version of the present invention tht is preferably employed. In FIG. 5 like reference characters will be made as previously used in identifying the main embodiment in FIGS. 1-4. Thus, in FIG. 5 there is shown the vacuum chuck 14 carrying the circuit chip 12 downwardly to engage the fine mesh screen 36. FIG. 5 also shows the liquid adhesive bath 24. In order to enhance the removal of the chip from the screen there is preferably provided a sponge 60 disposed between the screen and the liquid. Actually, the sponge material may simply be rested upon the liquid surface essentially between the surface and the screen disposed thereover. This sponge pad functions as a storage pad for the liquid adhesive and also as a spring in that it is compressed during the adhesive transfer step and assists in pushing the chip out of the adhesive. This sponge 60 may be made of any type of a sponge material such as one made of a synthetic plastic such as polyurethane foam or similar form rubber such as neoprene foam rubber.

Having described the method of this invention, it should now be apparent to those skilled in the art that numerous other embodiments are contemplated as falling within the scope of this invention. For example, in a more simplified embodiment of this invention, the leveling paddle may be eliminated, and the clamping ring may extend at least partially into the bath tray so as to hold the screen just about at liquid level. Although the use of a leveling paddle is preferred, a reduction in surface tension is still obtained even with the use of the more simplified embodiment wherein the leveling paddle is eliminated. Also, in another embodiment, the bath tray may be rotated through only a portion of a full rotation such as through a 180 degree rotation or possibly about 210 degree of rotation. In the simplified embodiment wherein the leveling paddle is not employed, then the bath tray may be held in a non-rotatable position which further simplifies the construction at the bath station. Actually, with regard to the rotation of the paddle, it is simplest and most preferred to simply rotate this through some random angle.

What is claimed is:

1. A method of applying a liquid glue to the surface of a circuit chip in which a bath tray is employed having a mesh screen disposed in the bath tray above the liquid glue level, said method comprising the steps of; providing a leveling paddle extending into the tray, causing relative rotation between the leveling paddle and the bath tray with the paddle sweeping across the screen to dip the screen into the liquid glue material, at the same time smoothing the glue over the screen, thereafter, pressing the circuit chip onto the mesh screen to receive the application of glue onto the circuit chip.

2. The method as set forth in claim 1 where, in the step of causing relative rotation the leveling paddle is held stationary and the bath tray is rotated.

* * * * *